(12) United States Patent
Miyata et al.

(10) Patent No.: US 7,518,230 B2
(45) Date of Patent: Apr. 14, 2009

(54) SEMICONDUCTOR CHIP AND SEMICONDUCTOR DEVICE

(75) Inventors: Osamu Miyata, Kyoto (JP); Tadahiro Morifuji, Kyoto (JP)

(73) Assignee: Rohm Co., Ltd, Kyoto (JP)

( * ) Notice: Subject to any disclaimer, the term of this patent is extended or adjusted under 35 U.S.C. 154(b) by 266 days.

(21) Appl. No.: 11/637,945

(22) Filed: Dec. 13, 2006

(65) Prior Publication Data

US 2007/0145565 A1 Jun. 28, 2007

(30) Foreign Application Priority Data

Dec. 14, 2005 (JP) ............................. 2005-360590
Dec. 16, 2005 (JP) ............................. 2005-363836

(51) Int. Cl.
*H01L 23/04* (2006.01)
*H01L 23/34* (2006.01)

(52) U.S. Cl. ...................... 257/698; 257/737; 257/724; 257/777; 257/659; 257/E23.021

(58) Field of Classification Search ................ 257/698, 257/737, 777, 659, 724, E23.021
See application file for complete search history.

(56) References Cited

U.S. PATENT DOCUMENTS

| | | | |
|---|---|---|---|
| 6,198,136 B1 * | 3/2001 | Voldman et al. ............. | 257/357 |
| 6,400,019 B1 * | 6/2002 | Hirashima et al. .......... | 257/737 |
| 6,482,730 B1 | 11/2002 | Masumoto et al. | |
| 6,507,117 B1 | 1/2003 | Hikita et al. | |
| 6,639,315 B2 * | 10/2003 | Kazama et al. ............. | 257/738 |
| 7,253,516 B2 * | 8/2007 | Coenen ...................... | 257/724 |
| 2001/0020743 A1 * | 9/2001 | Eldridge et al. ............. | 257/737 |
| 2002/0074653 A1 * | 6/2002 | Khandros et al. ........... | 257/724 |

FOREIGN PATENT DOCUMENTS

| | | |
|---|---|---|
| JP | 10-256308 | 9/1998 |
| JP | 2000-223652 | 8/2000 |
| JP | 2000-243729 | 9/2000 |

* cited by examiner

*Primary Examiner*—Nitin Parekh
(74) *Attorney, Agent, or Firm*—Rabin & Berdo, P.C.

(57) ABSTRACT

A semiconductor chip according to the present invention is a semiconductor chip having a circuit forming region, in which an internal circuit including a function element is formed, on the middle portion of the surface thereof, and having the surface thereof opposed to and joined to the surface of a solid-state device. The semiconductor chips includes: a plurality of bumps, formed so as to be ridged on the surface and brought into contact with the surface of the solid-state device, for electrically connecting the internal circuit with the solid-state device; power source wiring, formed in the surrounding region of the circuit forming region, to which power source voltage is supplied; ground wiring, formed in the surrounding region of the circuit forming region, which is grounded to ground potential; and protection elements, formed between the power source wiring and the ground wiring, which electrically intervenes between the bumps and the power source wiring and between the bumps and the ground wiring, respectively.

3 Claims, 3 Drawing Sheets

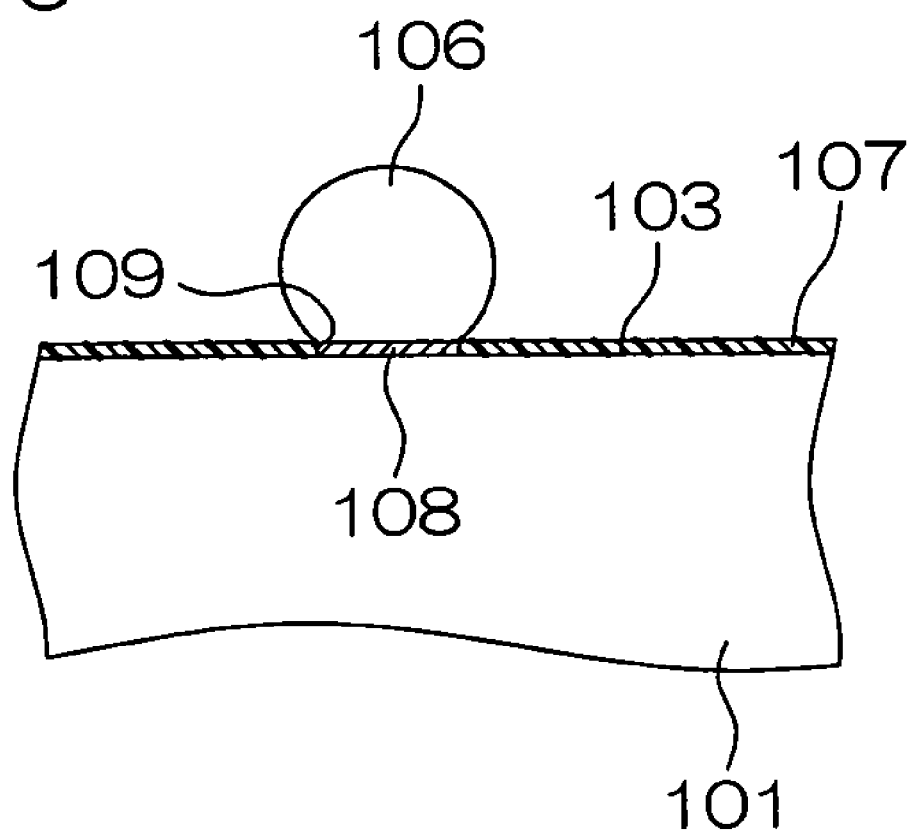

SEMICONDUCTOR CHIP AND SEMICONDUCTOR DEVICE

BACKGROUND OF THE INVENTION

1. Field of the Invention

The present invention relates to a semiconductor chip used for a chip-on-chip structure and a flip-chip bonding structure. Further, the present invention relates to a semiconductor device having a chip-on-chip structure.

2. Description of Related Art

As a structure for attempting to downsize and highly integrate a semiconductor device, a chip-on-chip structure and a flip-chip bonding structure have already been known, wherein the former joins the surface of a semiconductor chip to the surface of another semiconductor chip in an state opposed to each other, and the latter joins the surface of a semiconductor chip to a wiring substrate in a state opposed to each other.

A semiconductor chip applied to these structures is provided with a plurality of bumps made of a metal such as gold (Au) on the surface thereof. The respective bumps are electrically connected to internal circuits formed at the middle portion of the surface of the semiconductor chip. By joining together the bumps of one semiconductor chip and the bumps of another semiconductor chip with both thereof faced to each other in the chip-on-chip structure, mechanical connection between these semiconductor chips is completed, and at the same time, electrical connection between the internal circuits of the respective semiconductor chips is achieved. Further, by joining together the bumps of a semiconductor chip and a pad on a wiring substrate with both thereof faced to each other, the semiconductor chip is supported on the wiring substrate, and at the same time, electrical connection between the wiring on the wiring substrate and the internal circuits of the semiconductor chip is achieved.

As surge is brought in from the bump, there is a fear that the function elements, which compose the internal circuits, may be destroyed due to the surge. Therefore, a protection element that prevents surge from being brought in from the bump intervenes between the bump and the internal circuits.

However, in order to provide a protection element between the bump and the internal circuit, it is necessary to dispose a bump in a narrow region at the peripheral edge portion on the surface of the semiconductor chip. For this reason, freedom in the layout of bumps is remarkably restricted.

Further, if a plurality of bumps is disposed at the peripheral edge portion on the surface of respective semiconductor chips, uniformity in the stress between the middle portion of the semiconductor chip and the peripheral edge portion thereof may be lost when a force is given from the outside to the semiconductor chip. As a result, the semiconductor chip may be subjected to deformation (distortion).

Further, since the spacing between adjacent bumps in the direction along the surface of a semiconductor chip is narrow if bumps are concentratedly disposed at the peripheral edge portion of the semiconductor chip, there is a problem that resin is not smoothly flown into the inside region of the bumps when injecting resin (an under-filling material) to seal the clearance between one semiconductor chip and another semiconductor chip.

SUMMARY OF THE INVENTION

It is a first object of the present invention to provide a semiconductor chip capable of preventing internal circuits from being destroyed due to surge and increasing freedom in the layout of bumps.

It is a second object of the present invention to provide a semiconductor device capable of preventing a semiconductor chip from being deformed due to uneven stress and capable of smoothly injecting resin to seal the clearance between both semiconductor chips.

A semiconductor chip to achieve the first object has a circuit forming region, in which internal circuit including a function element is formed, disposed at the middle portion of a surface thereof, and has the surface opposed and joined to the surface of a solid-state device, and includes: a plurality of bumps, formed so as to be ridged on the surface and brought into contact with the surface of the solid-state device, for electrically connecting the internal circuit with the solid-state device; power source wiring, formed in the surrounding region of the circuit forming region, to which power source voltage is supplied; ground wiring, formed in the surrounding region of the circuit forming region, which is grounded to ground potential; and protection elements, formed between the power source wiring and the ground wiring, which electrically intervenes between the bumps and the power source wiring and between the bumps and the ground wiring, respectively.

According to the construction, when surge is brought in from a bump, it is possible to cause the surge current to be removed from the bump to the power source wiring and the ground wiring via the protection element. Accordingly, it is possible to prevent the internal circuits (function elements) from being destroyed due to bringing-in of the surge from the bump.

The protection element is formed between the power source wiring and the ground wiring. Therefore, it is possible to determine the layout of bumps regardless of an arrangement of the protection element. That is, it is possible to dispose the bump on the circuit forming region provided at the middle portion of the surface of the semiconductor chip. As a matter of course, the bump may be disposed in a peripheral region of the circuit forming region. As a result, freedom in the layout of the bumps can be increased.

The solid-state device may be a semiconductor chip separate from the semiconductor chip of the present invention or may be a wiring substrate.

A semiconductor device according to the present invention to achieve the second object has a chip-on-chip structure in which a first semiconductor chip and a second semiconductor chip are joined to each other in a state where a surface of the second semiconductor chip is opposed to a surface of the first semiconductor chip, and includes: a pad for external connection, which is disposed at a peripheral edge portion of the surface of the first semiconductor chip and is electrically connected to an internal circuit formed at the middle portion of the surface of the first semiconductor chip; a protection element intervening between the pad for external connection and the internal circuit; a plurality of first semiconductor chip side bumps electrically connected to the internal circuit and dispersedly disposed on the surface of the first semiconductor chip; and a plurality of second semiconductor chip side bumps electrically connected to an internal circuit formed at a middle portion of a surface of the second semiconductor chip, dispersedly disposed on the surface of the second semiconductor chip, and connected to the respective first semiconductor chip side bumps.

According to the construction, since the protection element is intervened between the pad for external connection and the internal circuit of the first semiconductor chip, it is not necessary to provide a protection element between the bump and the internal circuit of the first semiconductor chip. In addition, since the protection element is provided between the pad for external connection and the internal circuit of the first semiconductor chip and a signal is inputted only from the bump of the first semiconductor chip into the internal circuits of the second semiconductor chip, it is not necessary to provide the second semiconductor chip with any protection element to prevent surge from being brought in from the outside. Therefore, in both the first semiconductor chip and the second semiconductor chip, it is possible to dispersedly dispose bumps not only at the peripheral edge portions of the respective surfaces but also at the middle portion of the respective surfaces. With such arrangement of the bumps, when a force is applied from the outside to the respective semiconductor chips, it is possible to make almost even the stress that occurs at the middle portion and the peripheral edge portions of the respective semiconductor chips. As a result, deformation of the semiconductor chips due to uneven stress can be prevented from occurring. Further, since the spacing between the bumps can be increased, it is possible to smoothly inject resin (liquid resin) to seal the clearance between both the semiconductor chips. Accordingly, it is possible to seal the clearance between both the semiconductor chips by resin without any clearance.

The foregoing and other objects, features and effects of the present invention will become more apparent from the following detailed description of the embodiments with reference to the attached drawings.

BRIEF DESCRIPTION OF THE DRAWINGS

FIG. 5 is a schematic sectional view showing the vicinity of the surface of the primary chip shown in FIG. 3.

DETAILED DESCRIPTION OF PREFERRED EMBODIMENTS

Figure 1:
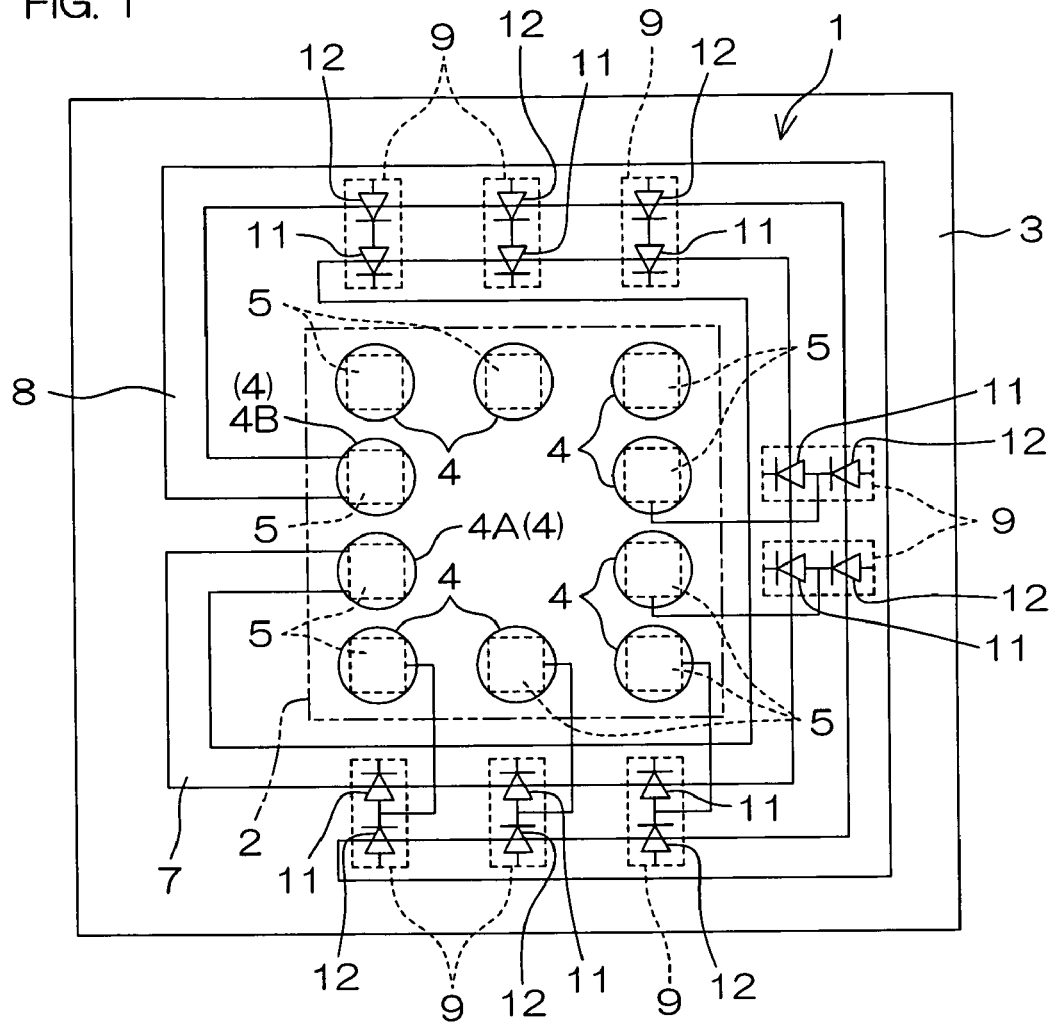
FIG. 1 is a schematic plan view of a semiconductor chip according to a first embodiment of the present invention.
Figure 2:
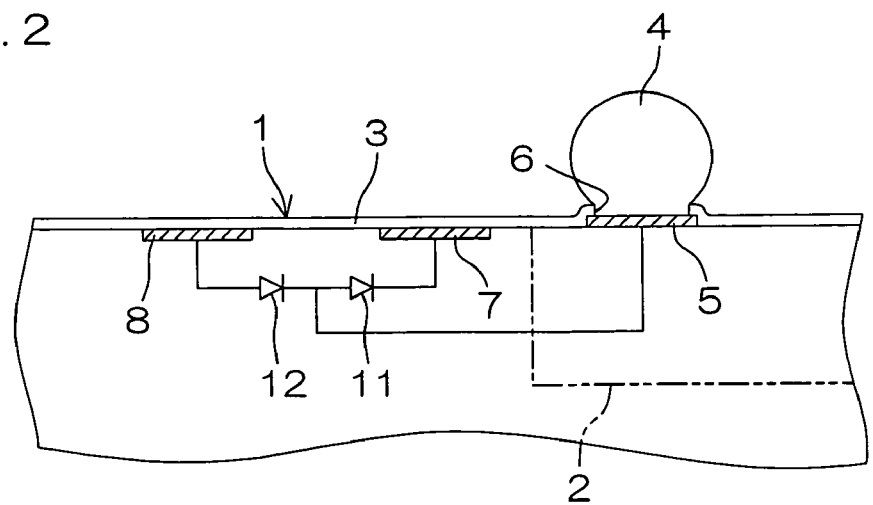
FIG. 2 is a sectional view obtained by cutting the semiconductor chip shown in FIG. 1 on the plane orthogonal to the surface thereof.

FIG. 1 is a schematic plan view of a semiconductor chip according to a first embodiment of the present invention. FIG. 2 is a sectional view obtained by cutting the semiconductor chip shown in FIG. 1 on the plane orthogonal to the surface thereof.

The semiconductor chip is applied to a so-called chip-on-chip structure and flip-chip bonding structure. The semiconductor chip has its surface 1 opposed to another semiconductor chip and wiring substrate and joined thereto.

The surface 1 of the semiconductor chip is the surface at the side where a circuit forming region 2 is formed at a semiconductor substrate (for example, silicon substrate) serving as the base substance of the semiconductor chip. The surface 1 of the semiconductor chip is covered by, for example, a surface production film 3 made of silicon nitride.

The circuit forming region 2 is provided at the middle portion of the surface 1 of a semiconductor chip. Internal circuits including a function element such as a transistor are built in the circuit forming region 2. A plurality of bumps 4 made of a metal material such as, for example, gold (Au) are aligned on the circuit forming region 2 with spacing provided therebetween. The respective bumps 4 are formed to be generally spherical, protruding from the surface protection film 3. In detail, as shown in FIG. 2, an opening 6 to expose a pad 5 electrically connected to the internal circuits formed in the circuit forming region 2 is formed in the surface protection film 3. Each of the bumps 4 is formed on the pad 5 and is formed to be generally spherical so as to be ridged on the surface protection film 3.

Power source wiring 7 and ground wiring 8 are formed around the circuit forming region 2 so as to surround the circuit forming region 2, respectively. One end of the power source wiring 7 is connected to a bump 4A for supplying power source to which power source voltage (for example, 5V) is supplied from a solid-state device. One end of the ground wiring 8 is connected to a bump 4B for grounding which is grounded to the ground potential (0V) (to which ground voltage is supplied from the solid-state device).

The power source wiring 7 and the ground wiring 8 are disposed with predetermined spacing therebetween. A plurality of protection circuits 9 corresponding to respective bumps 4 other than the bumps 4A and 4B are intervened between the power source wiring 7 and the ground wiring 8. The respective protection circuits 9 are configured to have two protection elements (protection diodes) 11 and 12 connected in series between the power source wiring 7 and the ground wiring 8. The protection circuit 9 is electrically connected to a pad 5 downward of the bump 4 corresponding thereto.

With this configuration, when positive surge is brought in from the bump 4, the surge current is caused to flow from the bump 4 into the power source wiring 7 via the protection element 11, and is removed via the pump 4A for power source supply from the power source wiring 7. On the other hand, when negative surge is brought in from the bump 4, the surge current is caused to flow from the pump 4 into the ground wiring 8 via the protection element 12, and is removed from the ground wiring 8 via the bump 4B for grounding. Therefore, it is possible to prevent the internal circuits (function elements) from being destroyed due to bringing-in of surge from the bump 4.

The protection circuit 9 is formed between the power source wiring 7 and the ground wiring 8. Therefore, it is possible to determine the layout of bumps 4 regardless of the arrangement of the protection circuit 9. That is, as in the semiconductor chip according to the embodiment, the bumps 4 can be disposed on the circuit forming region 2 provided at the middle portion of the surface 1 of the semiconductor chip. As a matter of course, the bumps 4 can be disposed in a region around the circuit forming region 2. As a result, freedom in the layout of bumps 4 can be increased.

The bump 4 may be made columnar or square pillar-shaped while it is herein formed to be generally spherical. Further, it is not necessary for the bump 4 to greatly be ridged on the surface protection film 3. Where a bump is provided on the surface of a solid-state device, the bump may be formed to be flat, and may be slightly ridged on the surface protection film 3.

In addition, an interlayer insulation film may be intervened between the semiconductor substrate and the surface protection film 3, and at the same time, the internal wiring may be formed on the interlayer insulation film, the internal wiring may be electrically connected to the internal circuit through an opening formed in the interlayer insulation film, and a pad 5 may be formed by exposing a part of the internal wiring from the opening formed in the surface protection film 3. Such routing of the internal wiring enables free changes in the position of the pad 5, whereby freedom in the layout of the bump 4 (pad 5) can be increased.

Figure 3:
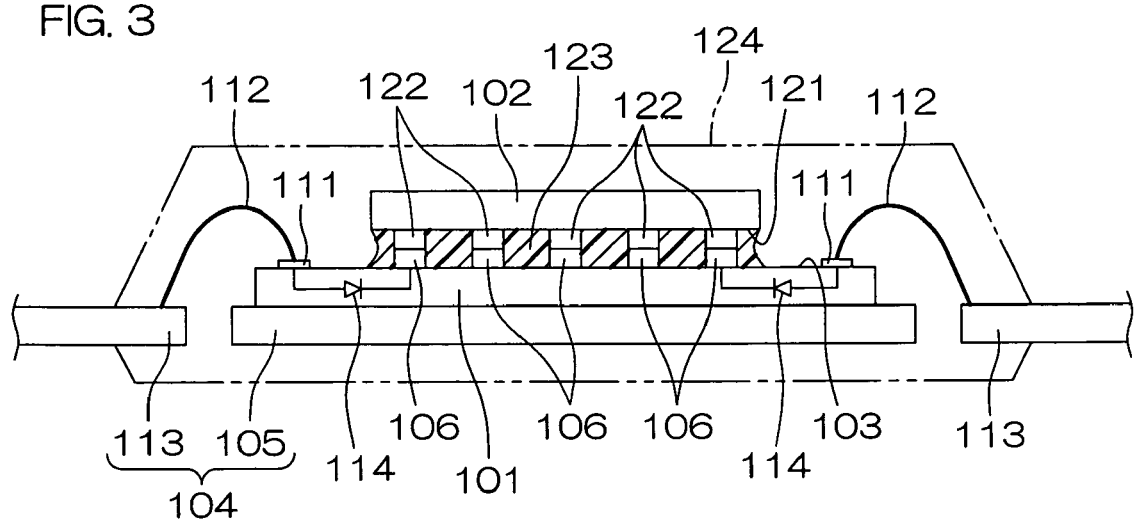
FIG. 3 is a schematic sectional view showing a configuration of a semiconductor device according to a second embodiment of the present invention.

FIG. 3 is a schematic sectional view showing a configuration of a semiconductor device according to a second embodiment of the present invention.

The semiconductor device has a chip-on-chip structure wherein a primary chip 101 serving as the first semiconductor chip and a secondary chip 102 serving as the second semiconductor chip are overlapped and joined to each other.

Figure 4:
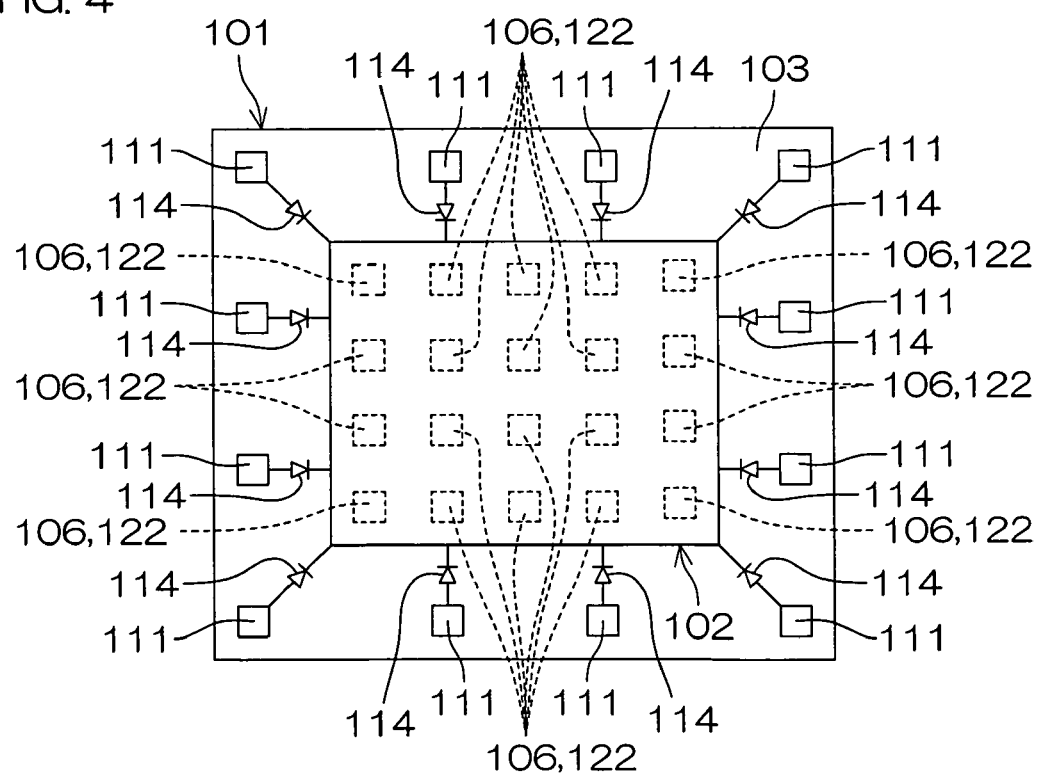
FIG. 4 is a plan view showing a junction of a primary chip and a secondary chip shown in FIG. 3 as viewed from the secondary chip side.

FIG. 4 is a plan view showing a junction of the primary chip 101 and the secondary chip 102 as viewed from the secondary chip 102 side. FIG. 5 is a schematic sectional view showing the vicinity of the surface of the primary chip 101.

The primary chip 101 is formed to be generally rectangular in its plan view. The primary chip 101 is die-bonded to an island portion 105 of a lead frame 104 with a surface 103 thereof (an active region side surface on which an internal circuit including a function element is formed) faced up.

A generally rectangular chip junction region on which the secondary chip 102 is joined is provided at the middle portion of the surface 103 of the primary chip 101. As shown in FIG. 4, a plurality of bumps 106 serving as first semiconductor chip side bumps, which are made of a metal material such as gold (Au), are aligned in the chip junction region with spacing therebetween. As shown in FIG. 5, the respective bumps 106 are formed to be ridged on a surface protection film 107 to cover the surface 103 of the primary chip 101. Specifically, an opening 109 to expose a pad 108 electrically connected to the internal circuit formed at the middle portion of the surface of the primary chip 101 is formed in the surface protection film 107. Each of the bumps 106 is formed on the pad 108 and is formed to be ridged on the surface protection film 107 from the opening 109.

In addition, a plurality of pads 111 for external connection are disposed, with spacing provided therebetween along the peripheral edge of the chip junction region (primary chip 101) on the peripheral edge portion surrounding the chip junction region. The respective pads 111 for external connection are electrically connected to the internal circuit formed at the middle portion of the surface of the primary chip 101. Further, each of the pads 111 for external connection is electrically connected (wire-bonded) to the lead portion 113 of the lead frame 104 via a bonding wire 112 as shown in FIG. 3.

Further, a protection element 114, which prevents function elements from being destroyed due to surge brought in from the pad 111 for external connection, is provided between each of the pads 111 for external connection and the internal circuit.

As shown in FIG. 4, the secondary chip 102 is formed to be generally rectangular and smaller than the primary chip 101 in the plan view. The secondary chip 102 is joined to the chip junction region of the surface 103 of the primary chip 101 with the surface 121 thereof (the surface at the active region side on which the internal circuit is formed) faced down.

A plurality of bumps 122 serving as second semiconductor chip side bumps, which are made of a metal material such as gold (Au), are disposed on the surface 121 of the secondary chip 102. The respective bumps 122 are disposed at positions opposed to the respective bumps 106 of the primary chip 101 in a state where the secondary-chip 102 is disposed opposite to the chip junction region of the primary chip 101. In the embodiment, as shown in FIG. 4, the plurality of bumps 106 are disposed in the form of a matrix of 4×5 on the surface 103 of the primary chip 101. On the other hand, the plurality of bumps 122 are disposed in the form of a matrix of 4×5 corresponding to the respective bumps 106 on the surface 121 of the secondary chip 102. Therefore, the plurality of bumps 106 and 122 are dispersedly disposed on the entire region of the chip junction region of the primary chip 101 and the surface 121 of the secondary chip 102.

Further, although not illustrated, an opening, which exposes a pad electrically connected to the internal circuit formed on the secondary chip 102, is formed in the surface protection film covering the surface 121 of the secondary chip 102. Each of the bumps 122 is provided on the pad, and is formed to be ridged on the surface protection film through the opening.

Since the respective bumps 106 of the primary chip 101 and the respective bumps 122 of the secondary chip 102 are joined to each other with the top surfaces thereof opposed to each other, the primary chip 101 and the secondary chip 102 are mechanically coupled to each other so as to keep predetermined spacing therebetween and are electrically joined to each other. An under-filling layer 123 is intervened between the surface 103 of the primary chip 101 and the surface 121 of the secondary chip 102, which protects the respective surfaces 103 and 121 by sealing the clearance therebetween. The under-filling layer 123 is formed by supplying liquid resin between the primary chip 101 and the secondary chip 102 and hardening the same after the primary chip 101 and the secondary chip 102 are joined to each other.

The primary chip 101 and the secondary chip 102 are sealed by molding resin 124 together with the lead frame 104 and the bonding wire 112. A part of the lead portion 113 of the lead frame 104 is exposed from the molding resin 124 and functions as an external connection portion (outer lead portion) for connection with a printed circuit board, etc.

As described above, since the protection element 114 is intervened between the pad for external connection and the internal circuit of the primary chip 101, there is no need to provide any protection element between the bump 106 and the internal circuit of the primary chip 101. Further, since the protection element 114 intervenes between the pad for external connection and the internal circuits of the primary chip 101 and a signal is inputted only from the bump 106 of the primary chip 101 into the internal circuit of the secondary chip 102 via the bump 122, there is no need to provide any protection element to prevent surge from being brought in the secondary chip 102 from the outside. Therefore, it is possible to dispersedly dispose the bumps 106 and 122 not only at the peripheral edge portion surrounding the middle portion on which the internal circuits of the respective surfaces are formed but also at the middle portion of the respective surfaces in the primary chip 101 and the secondary chip 102. By such an arrangement of the bumps 106 an 122, the stress that may occur at the middle portion and the peripheral edge portion of the primary chip 101 and the secondary chip 102 can be made substantially even when a force is applied to the semiconductor device from the outside thereof. As a result, it becomes possible to prevent the primary chip 101 and the secondary chip 102 from being deformed due to uneven stress. Further, since the spacing between the bumps 106 (the spacing between the bumps 122) can be increased, it is possible to smoothly inject liquid resin to form the under-filling layer 123 between the primary chip 101 and the secondary chip 102. As a result, it is possible to seal the clearance between the primary chip 101 and the secondary chip 102 without any clearance by means of the under-filling layer 123.

Although a configuration in which the bumps 106 and 122 are disposed in the form of a matrix of 4×5 is described, it is not necessary to dispose the bumps 106 and 122 in the form of a matrix, and the respective bumps 106 and 122 maybe dispersedly disposed with appropriate spacing therebetween without being concentrated at, for example, the peripheral edge portion surrounding the middle portion, on which the internal circuits are formed, on the surface 103 of the primary chip 101 and the surface 121 of the secondary chip 102.

Detailed descriptions were given of the embodiments of the present invention. However, the descriptions are merely examples that are used to clarify the technical contents of the present invention. The present invention should not be interpreted as being limited to these detailed examples. The spirit and scope of the present invention are restricted only by the claims attached hereto.

This application corresponds to Japanese Patent Application No. 2005-360590 filed in the Japanese Patent Office on Dec. 14, 2005 and Japanese Patent Application No. 2005-363836 filed in the Japanese Patent Office on Dec. 16, 2005, and the entire disclosures in these applications are incorporated herein by reference.

What is claimed is:

1. A semiconductor chip having a circuit forming region, in which an internal circuit including a function element is formed, on the middle portion of a surface thereof, and having the surface thereof opposed to and joined to a surface of a solid-state device, comprising:

a plurality of bumps, formed so as to be ridged on the surface and brought into contact with the surface of the solid-state device, for electrically connecting the internal circuit with the solid-state device;

power source wiring, formed in a surrounding region of the circuit forming region, to which power source voltage is supplied;

ground wiring, formed in the surrounding region of the circuit forming region, which is grounded to ground potential; and protection elements, formed between the power source wiring and the ground wiring, which electrically intervene between the bumps and the power source wiring and between the bumps and the ground wiring, respectively.

2. The semiconductor chip according to claim 1, wherein the solid-state device is a semiconductor chip separate from the semiconductor chip.

3. The semiconductor chip according to claim 1, wherein the solid-state device is a wiring substrate.

* * * * *